United States Patent [19]

Ishikawa

[11] Patent Number: 4,621,209
[45] Date of Patent: Nov. 4, 1986

[54] FREQUENCY-INDEPENDENT PHASE COMPENSATION CIRCUIT

[75] Inventor: Kazumasa Ishikawa, Hachioji, Japan

[73] Assignee: Olympus Optical Co., Ltd., Tokyo, Japan

[21] Appl. No.: 672,669

[22] Filed: Nov. 19, 1984

Related U.S. Application Data

[63] Continuation-in-part of Ser. No. 426,894, Sep. 29, 1982, abandoned.

[30] Foreign Application Priority Data

Nov. 6, 1981 [JP] Japan ................................ 56-177032

[51] Int. Cl.$^4$ ............................................. H03H 11/20
[52] U.S. Cl. ..................................... 307/511; 307/262; 307/521; 328/155
[58] Field of Search ............................ 307/510–513, 307/262, 521; 328/155; 332/16 R, 18

[56] References Cited

U.S. PATENT DOCUMENTS

| | | | |
|---|---|---|---|
| 3,322,970 | 5/1967 | Batteau | 307/510 X |
| 3,601,708 | 8/1971 | Stempler et al. | 307/511 X |
| 4,032,857 | 6/1977 | Lum | 328/155 X |
| 4,087,737 | 5/1978 | De Gennaro | 307/511 X |
| 4,232,399 | 11/1980 | Heiter | 328/155 X |
| 4,341,999 | 7/1982 | Rudish et al. | 307/511 X |
| 4,521,702 | 6/1985 | Kleinberg | 307/521 X |

Primary Examiner—Stanley D. Miller
Assistant Examiner—D. R. Hudspeth
Attorney, Agent, or Firm—Parkhurst & Oliff

[57] ABSTRACT

A phase compensation circuit for use in an automatic control system is disclosed. An input terminal is connected via a first adder, a signal line and a second adder to an output terminal, a series circuit of a variable resistor and a capacitor is connected between the signal line and ground potential, a voltage at a junction between the resistor and capacitor is fed back to the first adder via a first active circuit having an amplification of $(1-\beta)$ and fed forward to the second adder via a second active circuit having an amplification of $(\alpha-1)$. When the amplifications $(1-\beta)$ and $(\alpha-1)$ of the first and second active circuits are adjusted under the condition of $\alpha\beta=1$, a phase angle of a phase-frequency characteristic at a center frequency can be directly controlled, and when the variable resistor is adjusted, the center frequency can be controlled independently from the phase angle.

7 Claims, 9 Drawing Figures

FIG_4A
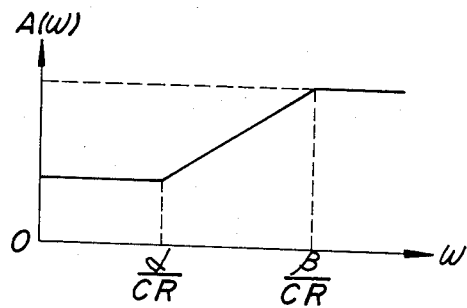
FIG_4B
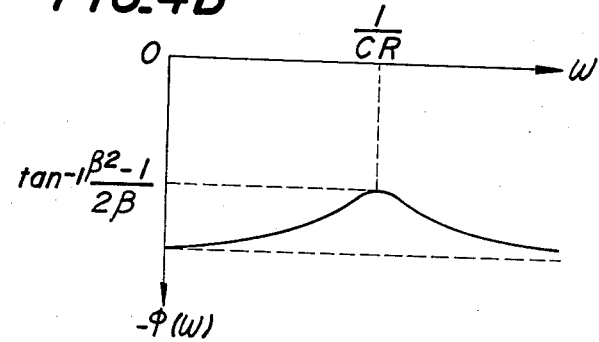
FIG_5
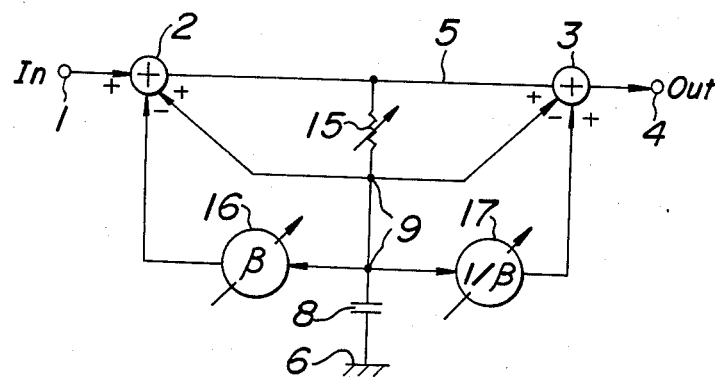

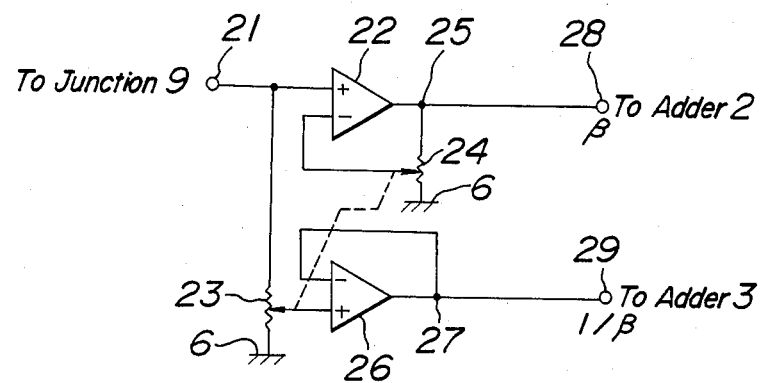
FIG_6
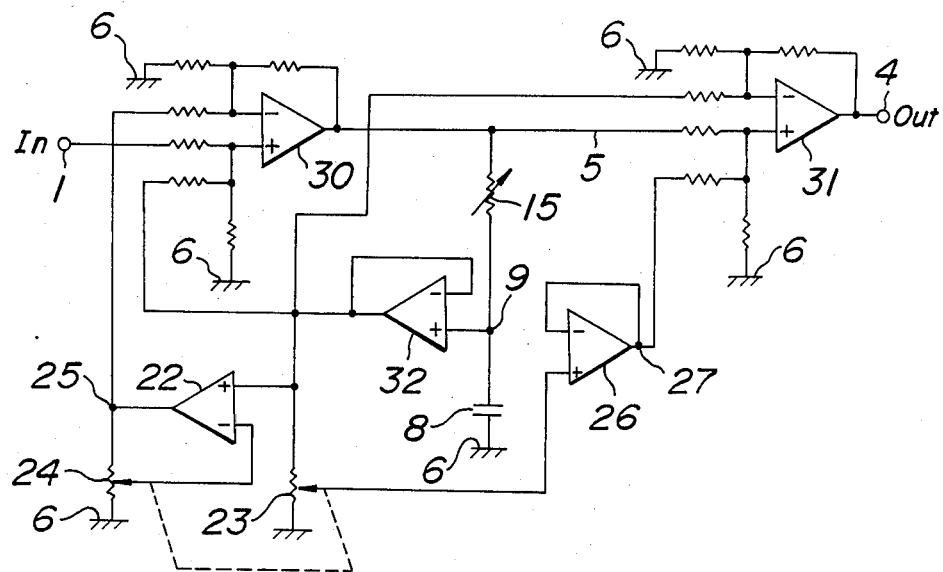
FIG_7

FREQUENCY-INDEPENDENT PHASE COMPENSATION CIRCUIT

CROSS REFERENCE TO RELATED APPLICATIONS

This application is a continuation-in-part of U.S. application Ser. No. 426,894, filed Sept. 29, 1982, abandoned.

BACKGROUND OF THE INVENTION

The present invention relates to a phase compensation circuit for compensating various characteristics of an automatic control system.

For instance, in a servo system, a phase lead circuit and a phase lag circuit are frequently used as a cascade compensating element. FIG. 1 is a circuit diagram showing a typical phase lead circuit. As is well known, a transfer function T(S) of the phase lead circuit is expressed as follows:

$$T(S) = \frac{S + \omega_1}{S + \omega_2} \quad (1)$$

where $\omega_1 = \frac{1}{CR_1}$, $\omega_2 \approx \frac{1}{C \cdot \frac{R_1 R_2}{R_1 + R_2}}$ Moreover, an amplitude-frequency function $A(\omega)$ and a phase-frequency function $\phi(\omega)$ are respectively represented by the following equations:

$$A(\omega) = \sqrt{\frac{\omega_1^2 + \omega^2}{\omega_2^2 + \omega^2}} \quad (2)$$

$$\phi(\omega) = \tan^{-1}\frac{\omega}{\omega_1} - \tan^{-1}\frac{\omega}{\omega_2} \quad (3)$$

FIGS. 2A and 2B are graphs showing characteristics of the amplitude-frequency function $A(\omega)$ and phase-frequency function $\phi(\omega)$, respectively. In the graphs shown in FIGS. 2A and 2B, a center frequency $\omega_0$ at which the maximum phase angle is obtained can be expressed as follows:

$$\omega_0 = \sqrt{\omega_1 \cdot \omega_2} \quad (4)$$

and an amount of the maximum phase angle $\phi_0$ at the center frequency $\omega_0$ is represented by the following equation (5):

$$\phi_0 = \tan^{-1}\frac{\omega_2}{\omega_1} - \tan^{-1}\frac{\omega_1}{\omega_2} \quad (5)$$

The center frequency $\omega_0$ and the maximum phase angle $\phi_0$ mentioned above can be determined by suitably selecting values of resistors $R_1$, $R_2$ and a capacitor C, provided that a frequency characteristic of an actuator, an error signal detection sensitivity, a servo loop gain, etc. of the servo system are all fixed. However, when the servo gain is to be adjusted or the frequency characteristic of the actuator is varied due to a temperature dependency thereof, it is extremely difficult to set up again the phase compensation characteristic in the most suitable condition in response to such an adjustment or variation. This is because of the fact that in the known phase compensation circuit, the phase-frequency characteristic could not be directly adjusted regardless of whether it is an active type or a passive type, but is varied in an indirect manner by changing cut-off frequencies $\omega_1$ and $\omega_2$ of the amplitude-frequency characteristic. Further, in the known phase compensation circuit, it is impossible to directly adjust the center frequency $\omega_0$ and the maximum phase angle $\phi_0$ independently from each other. In other words, if the center frequency $\omega_0$ is adjusted to a desired value, the maximum phase angle $\phi_0$ might be also changed.

SUMMARY OF THE INVENTION

The present invention has for its object to provide a phase compensation circuit which can eliminate the drawbacks mentioned above and whose phase-frequency characteristic can be controlled in a direct manner.

Another object of the invention is to provide a phase compensation circuit in which a center frequency of a phase-frequency characteristic and a phase angle at the center frequency can be adjusted independently from each other in a direct manner.

According to the invention, a phase compensation circuit comprises:

an input terminal for receiving an input signal to be phase-compensated;

an output terminal for deriving a phase-compensated output signal;

a signal line connecting said input and output terminals to each other;

a time constant circuit including a series connection of a resistor and a capacitor and connected between said signal line and a reference potential point;

a first active circuit having an amplification $(1-\beta)$ and connected between a junction between the resistor and capacitor of said time constant circuit and said input terminal for feeding-back a junction voltage at the junction to the input terminal; and a second active circuit having an amplification $(\alpha - 1)$ and connected between the junction and the output terminal for feeding-forward the junction voltage to the output terminal;

whereby a phase-frequency characteristic of the phase compensation circuit is directly controlled by adjusting the amplifications of the first and second active circuits, while a condition $\alpha\beta = 1$ is always satisfied.

BRIEF DESCRIPTION OF THE DRAWINGS

FIGS. 4A and 4B are graphs respectively showing amplitude-frequency and phase-frequency characteristics of the phase compensation circuit shown in FIG. 3;

FIG. 5 is a circuit diagram illustrating another embodiment of the phase compensation circuit according to the invention;

FIG. 6 is a circuit diagram depicting a specific construction of a constant multiplier of the phase compensation circuit shown in FIG. 5; and FIG. 7 is a circuit diagram showing a whole construction of the phase compensation circuit illustrated in FIG. 5.

DESCRIPTION OF THE PREFERRED EMBODIMENTS

Figure 1:
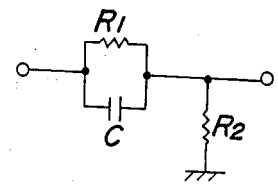
FIG. 1 is a circuit diagram showing one embodiment of a known phase lead circuit.
Figure 2A:
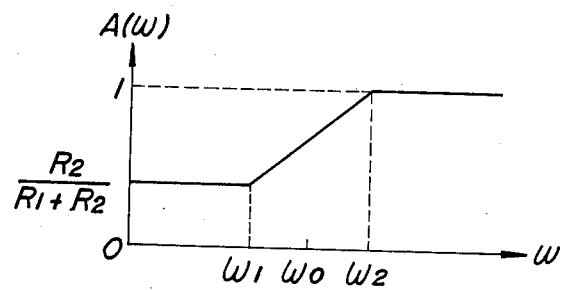
FIGS. 2A and 2B are graphs respectively illustrating an amplitude-frequency characteristic and a phase-frequency characteristic of the phase lead circuit shown in FIG. 1.
Figure 2B:
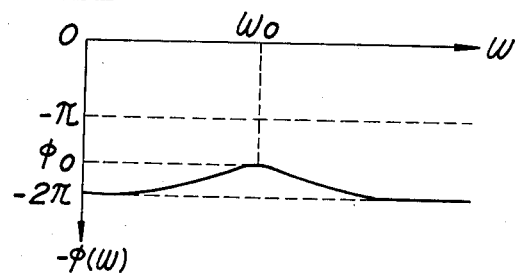
Figure 3:
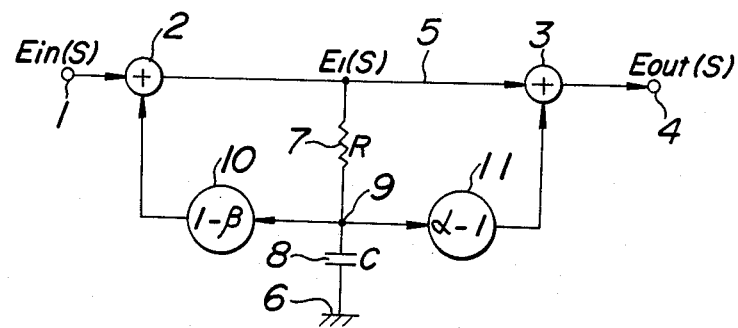
FIG. 3 is a circuit diagram depicting an embodiment of the phase compensation circuit according to the invention.

FIG. 3 is a circuit diagram showing a principal construction of a phase compensation circuit according to the invention. An input voltage signal applied to an input terminal 1 is applied to an output terminal 4 through a first adder 2, a signal line 5 and a second adder 3. Between the signal line 5 and a reference potential point (ground potential point) 6, a time constant circuit including a resistor 7 and a capacitor 8 is connected in series. A junction voltage generated at a junction 9 between the resistor 7 and capacitor 8 is fed back to the first adder 2 through a first active circuit 10 having an amplification of $(1-\beta)$. The junction voltage is fed forward to the second adder 4 through a second active circuit 11 having an amplification of $(\alpha-1)$. According to the invention, the amplifications $(1-\beta)$ and $(\alpha-1)$ of the first and second active circuits 10 and 11 are varied, while a condition of $\alpha\beta=1$ is always satisfied. Then, the phase-frequency characteristic can be directly adjusted.

Now, if it is assumed that $E_{in}(S)$ is the input voltage signal applied to the input terminal 1, $E_{out}(S)$ is the output voltage signal appearing at the output terminal 4, and $E_1(S)$ is an output signal of the first adder 2, the following equations are obtained:

$$E_1(S) = E_{in}(S) + E_1(S) \cdot T_0(S) \cdot (1-\beta) \tag{6}$$

$$E_{out}(S) = E_1(S) + E_1(S) \cdot T_0(S) \cdot (\alpha-1) \tag{7}$$

In these equations, $T_0(S)$ is a transfer function of the time constant circuit of the resistor 7 and the capacitor 8, and can be described as follows:

$$T_0(S) = \frac{\frac{1}{CR}}{S + \frac{1}{CR}}$$

where R is a resistance value of the resistor 7 and C is a capacitance value of the capacitor 8.

From the equations mentioned above, a transfer function T(S) of the phase compensation circuit shown in FIG. 3 can be expressed as follows:

$$T(S) = \frac{E_{out}(S)}{E_{in}(S)} = \frac{S + \omega_1}{S + \omega_2} \tag{8}$$

where $$\omega_1 = \frac{\alpha}{CR}, \quad \omega_2 = \frac{\beta}{CR} \tag{9}$$

If the $\omega_1$ and $\omega_2$ shown in the equation (9) are introduced in the equation (4), a center frequency $\omega_0$ at which the maximum phase angle $\phi_0$ is obtained can be derived as follows:

$$\omega_0 = \sqrt{\omega_1 \cdot \omega_2} = \frac{1}{CR}\sqrt{\alpha\beta} \tag{10}$$

Moreover, a phase angle $\phi_0$ at the center frequency $\omega_0$ can be derived from the equation (5) as follows:

$$\phi_0 = \tan^{-1}\sqrt{\frac{\beta}{\alpha}} - \tan^{-1}\sqrt{\frac{\alpha}{\beta}} \tag{11}$$

Here, when the conditions $\alpha\beta=1$ is given in the equations (10) and (11), the following equations are obtained.

$$\omega_0 = \frac{1}{CR} \tag{12}$$

$$\phi_0 = \tan^{-1}\beta - \tan^{-1}\frac{1}{\beta} = \tan^{-1}\frac{\beta^2 - 1}{2\beta} \tag{13}$$

That is to say, in the phase compensation circuit shown in FIG. 3, the center frequency $\omega_0$ at which the maximum phase angle $\phi_0$ is obtained is solely determined by a time constant CR of the resistor 7 and the capacitor 8 and the maximum phase angle $\phi_0$ is not dependent on the time constant CR. As clearly understood from the above, the phase-frequency characteristic can be directly controlled by changing the amplifications of the first and second active circuits 10 and 11, while the condition $\alpha\beta=1$ is always satisfied.

FIGS. 4A and 4B are graphs respectively showing the amplitude-frequency characteristic $A(\omega)$ and the phase-frequency characteristic $\phi(\omega)$ derived from the equation (8). As clearly seen from the FIGS. 4A and 4B, the condition for obtaining the phase compensation characteristic is as follows:

$$0 \leq \frac{\alpha}{CR} \leq \frac{1}{CR} \leq \frac{\beta}{CR} \leq +\infty \tag{14}$$

that is $$0 \leq \alpha \leq 1 \leq \beta \leq +\infty$$

FIG. 5 is a circuit diagram showing one embodiment of the phase compensation circuit according to the invention. In this embodiment, use is made of a variable resistor 15 as the resistor 7 in the time constant circuit having a variable time constant shown in FIG. 3. In addition, a junction voltage at the junction 9 is amplified by first and second constant multipliers 16 and 17 having amplifications $\beta$ and $1/\beta$ respectively, and further a voltage difference $(1-\beta)$ between the voltage at the junction 9 and an output voltage of the first constant multiplier 16 is applied to a first adder 2 and a voltage difference $(1/\beta - 1)$ between the voltage at the junction 9 and an output voltage of the second constant multiplier 17 is applied to a second adder 3. The remaining elements are denoted by the same reference numerals used in FIG. 3.

FIG. 6 is a circuit diagram showing one embodiment of the first and the second constant multipliers 16 and 17 shown in FIG. 5. An input terminal 21 is to be connected to the junction 9 shown in FIG. 5 and thus, the voltage at the junction 9 is applied to a non-inverting input terminal of an operational amplifier 22. Between the non-inverting input terminal of operational amplifier 22 and the reference potential point 6 is connected a potentiometer 23. The operational amplifier 22 is constructed as a non-inverting amplifier. To this end, a potentiometer 24 is connected between an output terminal 25 and the reference potential point 6 and a voltage produced at a tap of the potentiometer 24 is applied to an inverting input terminal of the operational amplifier 22. Moreover, a voltage at a tap of the potentiometer 23 is applied to a non-inverting input terminal of a operational amplifier 26, and further a voltage at an output terminal 27 of the operational amplifier 26 is applied to an inverting input terminal of the amplifier 26. Therefore, the operational amplifier 26 serves as a non-inverting amplifier having unit amplification. The taps of the potentiometers 23 and 24 are coupled with each other, so that voltages across the potentiometers are divided with the same ratio. The output terminals 25 and 27 of the amplifiers 22 and 26 are connected to output terminals 28 and 29, respectively.

In the embodiment shown in FIG. 6, the amplification of the operational amplifier 22 is varied from 1 to $+\infty$ by suitably adjusting the tap of the potentiometer 24. The amplification $\beta$ of the operational amplifier 22 is represented as follows:

$$\beta = \frac{R_i + R_f}{R_i}$$

wherein $R_i$ is a resistance value between the tap and one end of the potentiometer 24 connected to the reference potential point 6 and $R_f$ is a resistance value between the tap and the other end connected to the output terminal 25 of the operational amplifier 22.

As explained above, since the taps of the potentiometers 23 and 24 are moved in conjunction with each other, when these potentiometers 23 and 24 have the same resistance value, a potential at the tap of the potentiometer 23 is expressed as follows:

$$\frac{R_i}{R_i + R_f} = \frac{1}{\beta}$$

Therefore, by changing the taps of the potentiometers 23 and 24 having the same resistance value in conjunction with each other, it is possible to change the amplifications of the operational amplifiers 22 and 26 in accordance with a ratio of $\beta$ and $1/\beta$, while a product of these amplifications always remains unity. The voltage amplified by $\beta$ appearing at the output terminal 28 is applied to the adder 2 and the voltage amplified by $1/\beta$ appearing at the output terminal is applied to the adder 3.

FIG. 7 is a circuit diagram showing a whole construction of the phase compensation circuit shown in FIG. 5 according to the invention. In the embodiment shown in FIG. 7, an input voltage signal applied to the input terminal of an operational amplifier 30, and an output signal of the operational amplifier 30 is further supplied to a non-inverting input terminal of an operational amplifier 31 so as to generate a phase compensated output signal at the output terminal 4. The voltage at the junction 9 between the variable resistor 15 and the capacitor 8 is applied to a non-inverting input terminal of an operational amplifier 32 and an output signal of the operational amplifier 32 is fed back to an inverting input terminal thereof, so that the operational amplifier 32 serves as an amplifier having a unit amplification. In addition, the output signal of the operational amplifier 32 is applied to a non-inverting input terminal of the operational amplifier 30 as well as to an inverting input terminal of the operational amplifier 31.

The output voltage of the operational amplifier 32 is further applied to the non-inverting input of the operational amplifier 22, and the voltage at the output terminal 25 of the operational amplifier 22 amplified by $\beta$ is applied to the inverting input of the operational amplifier 30. The voltage at the output terminal 27 of the operational amplifier 26 amplified by $1/\beta$ is applied to the non-inverting input of the operational amplifier 31. The taps of the potentiometers 23 and 24 are moved in conjunction with each other.

The voltage at the junction 9 is multiplied by the operational amplifier 22 and 26 with $\beta$ and $1/\beta$, respectively, and the thus multiplied voltages are applied to the inverting input terminal of the operational amplifier 30 and the non-inverting input terminal of the operational amplifier 31, respectively. In the phase compensation circuit shown in FIG. 7, the center frequency of the phase characteristic and the phase angle at the center frequency can be controlled independently from each other in a direct manner by adjusting the potentiometers 23, 24 and the variable resistor 15, respectively, and therefore the phase-frequency characteristic can be set to any desired one in a simple and accurate manner.

The present invention is not limited to the embodiments mentioned above, but various alternatives and modifications are possible. For example, in the embodiment shown in FIG. 7, use is made of the variable resistor 15 in the variable time constant circuit so as to control the center frequency of the phase-frequency characteristic, but it is possible to make only C or both C and R in the time constant circuit variable to control the center frequency. Moreover, instead of using the potentiometers 23, 24 and variable resistor 15, use may be made of an attenuator comprising a D/A converter which can be controlled externally. In such a construction, it is possible to apply the circuit according to the invention not only to the servo system, but also to other various automatic control systems.

What is claimed is:

1. A phase compensation circuit comprising:
    an input terminal for receiving an input signal to be phase-compensated;
    an output terminal for deriving a phase-compensated output signal;
    a signal line connecting said input and output terminals to each other;
    a time constant circuit including a series connection of a resistor and a capacitor and connected between said signal line and a reference potential point;
    a first active circuit having an amplification $(1-\beta)$ and connected between a junction between the resistor and capacitor of said time constant circuit and said input terminal for feeding-back a junction voltage at the junction to the input terminal; and
    a second active circuit having an amplification $(\alpha -1)$ and connected between the junction and the output terminal for feeding-forward the junction voltage to the output terminal;
    whereby a phase-frequency characteristic of the phase compensation circuit is directly controlled by adjusting the amplifications of the first and second active circuits, while a condition $\alpha\beta=1$ is always satisfied.

2. A circuit according to claim 1, wherein said first and second active circuits are so constructed that the amplification $(1-\beta)$ of the first active circuit and the amplification $(\alpha-1)$ of the second active circuit can be adjusted simultaneously in conjunction with each other.

3. A circuit according to claim 2, wherein said first active circuit comprises a first adder having first, second and third inputs and an output, wherein said second input of and first adder is an inverting input, the first input of said first adder being connected to the input terminal and the output of said first adder being connected to the signal line, a first constant multiplier for applying the junction voltage multiplied by $\beta$ to the second inverting input of the first adder and a first connection for directly applying the junction voltage to the third input of the first adder, and said second active circuit comprises a second adder having first, second and third inputs and an output, wherein said third input of said second adder is an inverting input, the first input of said second adder being connected to the signal line and the output of said second adder being connected to the output terminal, a second constant multiplier for applying the junction voltage multiplied by $1/\beta$ to the second input of the second adder and a second connection for directly applying the junction voltage to the third inverting input of the second adder, whereby the first active circuit has the amplification of $(1-\beta)$ and the second active circuit has the amplification of $(1/\beta-1)$.

4. A circuit according to claim 3, wherein said first constant multiplier comprises a first operational amplifier having a non-inverting input connected to the junction, an inverting input, and an output connected to the second input of the first adder, and a first potentiometer coupled between the output of the first operational amplifier and the reference potential point and having a tap connected to the inverting input of the first operational amplifier; and said second constant multiplier comprises a second operational amplifier having a non-inverting input, an inverting input and an output connected to the second input of the second adder as well as to the inverting input of the second operational amplifier, and a second potentiometer coupled between the junction and the reference potential point and having a tap connected to the non-inverting input of the second operational amplifier; whereby the first and second potentiometers have the same resistance value, and their taps are moved in conjunction with each other.

5. A circuit according to claim 4, wherein
said first adder comprises a third operational amplifier having a non-inverting input connected to the input terminal, an inverting input connected to the output of the first operational amplifier and an output connected to the signal line,
said second adder comprises a fourth operational amplifier having a non-inverting input connected to the signal line and to the output of the second operational amplifier, an inverting input and an output connected to the output terminal, and
the circuit further comprises,
a fifth operational amplifier having a non-inverting input connected to the junction of the time constant circuit, and an output connected to the non-inverting input of the third operational amplifier, to the inverting input of the fourth operational amplifier, to the second potentiometer and to the input of the fifth operational amplifier.

6. A circuit according to claim 1, wherein said time constant circuit has a variable time constant and a center frequency of the phase-frequency characteristic of the circuit is directly controlled by adjusting the variable time constant.

7. A circuit according to claim 6, wherein the resistor of the time constant circuit comprises a variable resistor.

* * * * *